United States Patent
Chen et al.

(10) Patent No.: US 11,424,191 B2
(45) Date of Patent: Aug. 23, 2022

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/917,388

(22) Filed: Jun. 30, 2020

(65) Prior Publication Data

US 2021/0407920 A1    Dec. 30, 2021

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/105* (2013.01); *H01L 25/50* (2013.01); *H01L 2221/68372* (2013.01);
(Continued)

(58) Field of Classification Search
CPC ............. H01L 23/5389; H01L 23/5386; H01L 21/4857; H01L 24/19; H01L 21/4853; H01L 21/568; H01L 21/78; H01L 21/565; H01L 25/105; H01L 23/3128; H01L 21/6835; H01L 23/5383; H01L 25/50; H01L 24/20; H01L 2225/1035; H01L 2224/214; H01L 2224/2105; H01L 2225/1058; H01L 2221/68372
See application file for complete search history.

(56) References Cited

U.S. PATENT DOCUMENTS 5,629,566 A * 5/1997 Doi .................. H01L 24/31
257/789
6,221,751 B1   4/2001 Chen et al.
(Continued)

FOREIGN PATENT DOCUMENTS

KR    20000070442 A    11/2000
KR    20200002630 A    1/2020
(Continued)

*Primary Examiner* — Kyoung Lee
*Assistant Examiner* — Christina A Sylvia
(74) *Attorney, Agent, or Firm* — Slater Matsil, LLP

(57) ABSTRACT

A semiconductor device and method of manufacture are provided wherein semiconductor devices are attached over a semiconductor substrate. An opening is formed within metallization layers over the semiconductor substrate and the semiconductor substrate, and an encapsulant is placed to fill the opening. Once the encapsulant is placed, the semiconductor substrate is singulated to separate the devices. By recessing the material of the metallization layers and forming the opening, delamination damage may be reduced or eliminated.

20 Claims, 13 Drawing Sheets

(51) Int. Cl.
  *H01L 23/31* (2006.01)
  *H01L 21/683* (2006.01)
  *H01L 21/48* (2006.01)
  *H01L 21/56* (2006.01)
  *H01L 21/78* (2006.01)
  *H01L 25/00* (2006.01)
  *H01L 25/10* (2006.01)

(52) U.S. Cl.
  CPC .................. *H01L 2224/214* (2013.01); *H01L 2224/2105* (2013.01); *H01L 2225/1035* (2013.01); *H01L 2225/1058* (2013.01)

(56) References Cited

U.S. PATENT DOCUMENTS

| | | |
|---|---|---|
| 2010/0072635 A1 | 3/2010 | Kuo et al. |
| 2012/0074585 A1 | 3/2012 | Koo et al. |
| 2012/0098123 A1* | 4/2012 | Yu .................... H01L 23/49822 257/737 |
| 2013/0134559 A1 | 5/2013 | Lin et al. |
| 2014/0138791 A1* | 5/2014 | Chan ................ H01L 23/49816 257/528 |
| 2015/0069623 A1* | 3/2015 | Tsai ...................... H01L 25/117 257/774 |
| 2017/0250171 A1* | 8/2017 | Yu ........................... H01L 24/19 |
| 2019/0164860 A1* | 5/2019 | Lin ..................... H01L 23/3128 |
| 2019/0333871 A1 | 10/2019 | Chen et al. |
| 2020/0006241 A1 | 1/2020 | Wu et al. |
| 2020/0118915 A1 | 4/2020 | Yu et al. |

FOREIGN PATENT DOCUMENTS

| | | |
|---|---|---|
| KR | 20200071014 A | 6/2020 |
| TW | 201246482 A | 11/2012 |
| TW | 201322406 A | 6/2013 |
| TW | 201946233 A | 12/2019 |

* cited by examiner

SEMICONDUCTOR DEVICES AND METHODS OF MANUFACTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
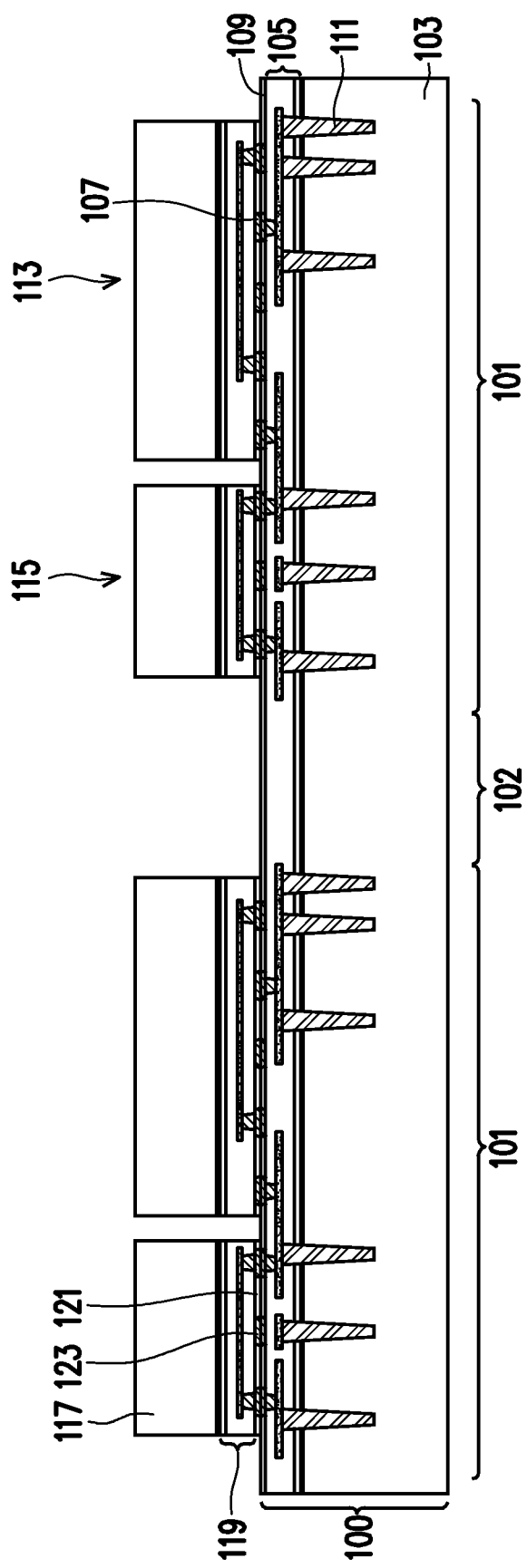
FIG. 1 illustrates a semiconductor wafer with semiconductor devices attached to the semiconductor wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to specific embodiments which utilize a partial singulation process prior to a full singulation. Such an order of steps and their resulting structures provides an improved process and structure that helps to reduce or eliminate peeling of dielectric layers that can otherwise occur.

With reference now to FIG. 1, a semiconductor wafer 100 is illustrated with multiple first semiconductor devices 101 formed with and over the semiconductor wafer 100. In a particular embodiment the first semiconductor devices 101 may be a memory device, such as a wide I/O dynamic random access memory (DRAM) device which has a large number of I/O interfaces, such as greater than 256 interfaces, so that a large bandwidth of data may be realized even at low clock speeds. However, the first semiconductor devices 101 may also be any other suitable type of memory device with a high rate of data transfer, such as an LPDDRn memory device or the like, that has a high rate of data transfer, or may be any other suitable device, such as logic dies, central processing unit (CPU) dies, input/output dies, combinations of these, or the like. Additionally, the semiconductor wafer 100 may be received by the manufacturer from a third party manufacturer, or may be manufactured in house.

In an embodiment the first semiconductor devices 101 may comprise a first substrate 103, first active devices, first metallization layers 105, a first wafer bond layer 109, and first conductive wafer bond material 107. The first substrate 103 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor devices 101. The first active devices may be formed using any suitable methods either within or else on the first substrate 103.

The first metallization layers 105 are formed over the first substrate 103 and the first active devices and are designed to connect the various active devices to form functional circuitry. In an embodiment the first metallization layers 105 are formed of alternating layers of dielectric (e.g., low-k dielectric materials, extremely low-k dielectric material, ultra low-k dielectric materials, combinations of these, or the like) and conductive material and may be formed through any suitable process (such as deposition, damascene, dual damascene, etc.). In an embodiment there may be four layers of metallization separated from the first substrate 103 by at least one interlayer dielectric layer (ILD), but the precise number of first metallization layers 105 is dependent upon the design of the first semiconductor devices 101.

The first wafer bond layer 109 may be formed on the first substrate 103 over the first metallization layers 105. The first wafer bond layer 109 may be used for hybrid bonding or fusion bonding (also referred to as oxide-to-oxide bonding). In accordance with some embodiments, the first wafer bond layer 109 is formed of a silicon-containing dielectric material such as silicon oxide, silicon nitride, or the like. The first wafer bond layer 109 may be deposited using any suitable method, such as, atomic layer deposition (ALD), CVD, high-density plasma chemical vapor deposition (HDPCVD), PVD, or the like to a thickness of between about 1 nm and about 1000 nm, such as about 5 nm. However, any suitable material, process, and thickness may be utilized.

Once the first wafer bond layer 109 has been formed, bond openings may be formed within the first wafer bond layer 109 to prepare for the formation of the first conductive wafer bond material 107. In an embodiment the bond openings may be formed by first applying and patterning a photoresist over the top surface of the first wafer bond layer 109. The photoresist is then used to etch the first wafer bond layer 109 in order to form the openings. The first wafer bond layer 109 may be etched by dry etching (e.g., reactive ion etching (RIE) or neutral beam etching (NBE)), wet etching, or the like. In accordance with some embodiments of the present disclosure, the etching stops on the first metallization layers 105 such that the first metallization layers 105 are exposed through the openings in the first wafer bond layer 109.

Once the first metallization layers 105 have been exposed, the first conductive wafer bond material 107 may be formed in physical and electrical contact with the first metallization layers 105. In an embodiment the first conductive wafer bond material 107 may comprise a barrier layer, a seed layer, a fill metal, or combinations thereof (not separately illustrated). For example, the barrier layer may be blanket deposited over the first metallization layers 105. The barrier layer may comprise titanium, titanium nitride, tantalum, tantalum nitride, or the like. The seed layer may be a conductive material such as copper and may be blanket deposited over the barrier layer using processes such as sputtering, evaporation, or plasma-enhanced chemical vapor deposition (PECVD), or the like, depending upon the desired materials. The fill metal may be a conductor such as copper or a copper alloy and may be deposited over the seed layer to fill or overfill the openings through a plating process such as electrical or electroless plating. Once the fill metal has been deposited, excess material of the fill metal, the seed layer, and the barrier layer may be removed from outside of the openings through a planarization process such as chemical mechanical polishing. However, while a single damascene process has been described, any suitable method, such as a dual damascene process, may also be utilized.

However, the above described embodiment in which the first wafer bond layer 109 is formed, patterned, and the first conductive wafer bond material 107 is plated into openings before being planarized is intended to be illustrative and is not intended to be limiting upon the embodiments. Rather, any suitable method of formation of the first wafer bond layer 109 and the first conductive wafer bond material 107 may be utilized. In other embodiments, the first conductive wafer bond material 107 may be formed first using, for example, a photolithographic patterning and plating process, and then dielectric material is used to gap fill the area around the first conductive wafer bond material 107 before being planarized using a planarization process. Any such manufacturing process is fully intended to be included within the scope of the embodiments.

Additionally, at any desired point in the manufacturing process, through substrate vias 111 may be formed within the first substrate 103 and, if desired, one or more layers of the first metallization layers 105, in order to provide electrical connectivity from a front side of the first substrate 103 to a back side of the first substrate 103. In an embodiment the TSVs 111 may be formed by initially forming through silicon via (TSV) openings into the first substrate 103 and, if desired, any of the overlying first metallization layers 105 (e.g., after the desired first metallization layer 105 has been formed but prior to formation of the next overlying first metallization layer 105). The TSV openings may be formed by applying and developing a suitable photoresist, and removing portions of the underlying materials that are exposed to a desired depth. The TSV openings may be formed so as to extend into the first substrate 103 to a depth greater than the eventual desired height of the first substrate 103. Accordingly, while the depth is dependent upon the overall designs, the depth may be between about 20 μm and about 200 μm, such as a depth of about 50 μm.

Once the TSV openings have been formed within the first substrate 103 and or any first metallization layers 105, the TSV openings may be lined with a liner. The liner may be, e.g., an oxide formed from tetraethylorthosilicate (TEOS) or silicon nitride, although any suitable dielectric material may be used. The liner may be formed using a plasma enhanced chemical vapor deposition (PECVD) process, although other suitable processes, such as physical vapor deposition or a thermal process, may be used. Additionally, the liner may be formed to a thickness of between about 0.1 μm and about 5 μm, such as about 1 μm.

Once the liner has been formed along the sidewalls and bottom of the TSV openings, a barrier layer may be formed and the remainder of the TSV openings may be filled with first conductive material. The first conductive material may comprise copper, although other suitable materials such as aluminum, alloys, doped polysilicon, combinations thereof, and the like, may be utilized. The first conductive material may be formed by electroplating copper onto a seed layer, filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Additionally, a scribe region 102 is formed between the different ones of the first semiconductor devices 101. In an embodiment the scribe region 102 may be a region through which a singulation may be performed to separate a first one of the first semiconductor devices 101 from a second one of the first semiconductor devices 101. The scribe region 102 may be formed by simply not forming any structures which will be utilized during operation of the first semiconductor devices 101, although some structures, such as testing structures, may be formed within the scribe region 102.

FIG. 1 additionally illustrates a bonding of second semiconductor devices 113 and third semiconductor device 115 to the first conductive wafer bond material 107 and the first wafer bond layer 109. In an embodiment each of the second semiconductor devices 113 and the third semiconductor devices 115 may each be a system on chip device, such as a logic device, which is intended to work in conjunction with the first semiconductor devices 101 (e.g., the wide I/O DRAM devices). However, any suitable functionality, such as logic dies, central processing unit (CPU) dies, input/output dies, combinations of these, or the like, may be utilized.

In an embodiment the second semiconductor devices 113 and the third semiconductor device 115 may each have second substrates 117, second active devices, second metallization layers 119, second wafer bond layers 121, and second conductive wafer bond material 123. In an embodiment the second substrates 117, second active devices, second metallization layers 119, second wafer bond layers 121, and second conductive wafer bond material 123 may be formed similar to the first substrate 103, the first active devices, the first metallization layers 105, the first wafer bond layer 109, and the first conductive wafer bond material 107, described above with respect to FIG. 1. However, in other embodiments these structures may be formed using different processes and different materials.

Once the second semiconductor device 113 and the third semiconductor devices 115 have been prepared, the second semiconductor device 113 and the third semiconductor devices 115 are bonded to the first semiconductor devices 101 using, for example, hybrid bonding. In an embodiment the surfaces of the first semiconductor devices 101 (e.g., the first wafer bond layer 109 and the first conductive wafer bond material 107) and the surfaces of the second semiconductor device 113 and the third semiconductor devices 115 (e.g., the second wafer bond layers 121 and the second conductive wafer bond material 123) may initially be activated. Activating the top surfaces of the first semiconductor devices 101, the second semiconductor devices 113, and the third semiconductor devices 115 may comprise a dry treatment, a wet treatment, a plasma treatment, exposure to an inert gas plasma, exposure to $H_2$, exposure to $N_2$, exposure to $O_2$, or combinations thereof, as examples. In embodiments where a wet treatment is used, an RCA cleaning may be used, for example. In another embodiment, the activation process may comprise other types of treatments. The activation process assists in the hybrid bonding of the first semiconductor devices 101, second semiconductor devices 113 and the third semiconductor devices 115.

After the activation process, the second semiconductor devices 113 and the third semiconductor devices 115 may be placed into contact with the first semiconductor devices 101. In a particular embodiment in which hybrid bonding is utilized, the first conductive wafer bond material 107 is placed into physical contact with the second conductive wafer bond material 123 while the first wafer bond layer 109 is placed into physical contact with the second wafer bond layers 121. With the activation process chemically modifying the surfaces, the bonding process between the materials is begun upon the physical contact.

Once physical contact has begun the bonding process, the bonding may then be strengthened by subjecting the assembly to a thermal treatment. In an embodiment the first semiconductor devices 101, the second semiconductor devices 113, and the third semiconductor devices 115 may be subjected to a temperature between about 200° C. and about 400° C. to strengthen the bond between the first wafer bond layer 109 and the second wafer bond layers 121. The first semiconductor devices 101, the second semiconductor devices 113, and the third semiconductor devices 115 may then be subjected to a temperature at or above the eutectic point for material of the first conductive wafer bond material 107 and the second conductive wafer bond material 123. In this manner, fusion of the first semiconductor devices 101, the second semiconductor devices 113, and the third semiconductor devices 115 forms a hybrid bonded device.

Additionally, while specific processes have been described to initiate and strengthen the hybrid bonds between the first semiconductor devices 101, the second semiconductor devices 113, and the third semiconductor devices 115, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Also, while hybrid bonding has been described as one method of bonding the first semiconductor devices 101 to the second semiconductor devices 113 and the third semiconductor devices 115, this as well is only intended to be illustrative and is not intended to be limiting upon the embodiments. Rather, any suitable method of bonding, such as fusion bonding, copper-to-copper bonding, or the like, or even solder bonding using, e.g., a ball grid array, may also be utilized. Any suitable method of bonding the first semiconductor devices 101 to the second semiconductor devices 113 and the third semiconductor devices 115 may be utilized.

Figure 2:
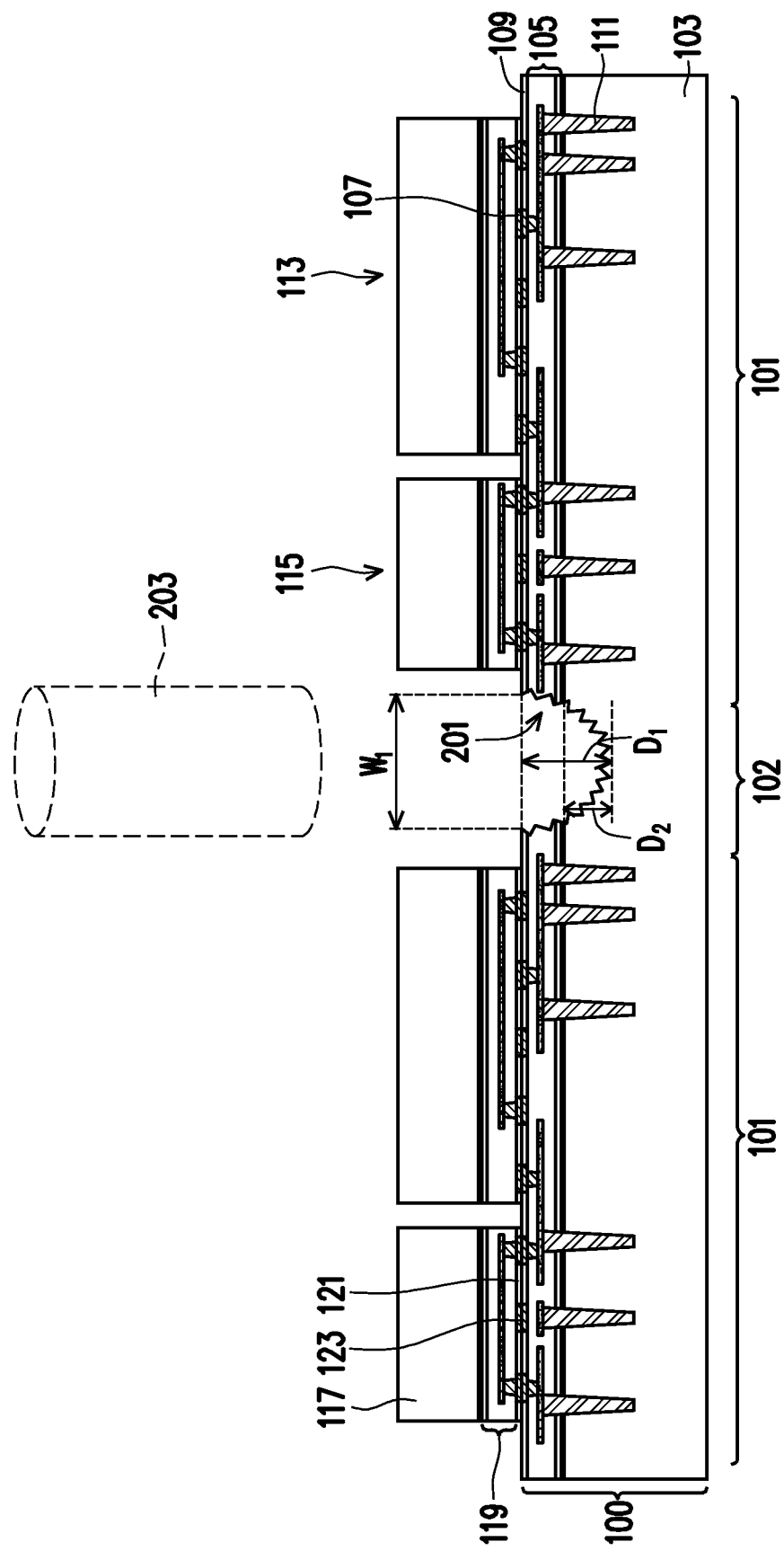
FIG. 2 illustrates a formation of an opening, in accordance with some embodiments.

FIG. 2 illustrates formation of a first opening 201 that is pre-cut into the scribe region 102 located between the first semiconductor devices 101. The first opening 201 is utilized to remove material from the first metallization layers 105 and other layers (e.g., the extremely low-k material from the first metallization layers 105) which may be more prone to delamination during a subsequent separation process, such as a sawing process (described further below). By removing and recessing these materials within the scribe region 102 in a controlled manner at this point in the process, these materials are not touched during later singulation processes and damage due to delamination may be reduced.

In an embodiment the first opening 201 may be formed using a laser ablation process (represented in FIG. 2 by the dashed cylinder labeled 203). For example, a laser is directed towards those portions of the first metallization layers 105 which are desired to be removed. During the laser drilling process the drill angle of about 0 degree (perpendicular to the first metallization layers 105) to about 30 degrees to normal of the first metallization layers 105. However, any suitable parameters for the laser ablation process 203 may be utilized.

By utilizing the laser ablation process 203, the first opening 201 may be formed to a first depth $D_1$ of between about 11 μm and about 20 μm, such as about 15 μm. As such, the first opening 201 will extend into the first substrate 103 to a second depth $D_2$ of between about 3 μm and about 8 μm, such as about 5 μm. Additionally, the first opening 201 may be formed to have a first width $W_1$ of between about 50 μm and about 80 µm, such as about 60 µm. However, any suitable dimensions may be utilized.

Additionally, by utilizing the laser ablation process 203 the shape of the first opening 201 will be irregular. For example, the first opening 201 may have a roughly circular shape, instead of straight sidewalls, that are formed from the laser ablation process 203. Further, the directing of the laser ablation process 203 will cause an uneven removal of material, resulting in the presence of indentations within the material of the first substrate 103.

However, while the laser ablation process 203 is described as one possible embodiment to form the first opening 201, the description of the laser ablation process 203 is intended to be illustrative and is not intended to be limiting. Rather, any suitable process that can remove the desired materials, such as a photolithographic masking and etching process which may result in straight sidewalls, may also be utilized. All such processes are fully intended to be included within the scope of the embodiments.

Figure 3:
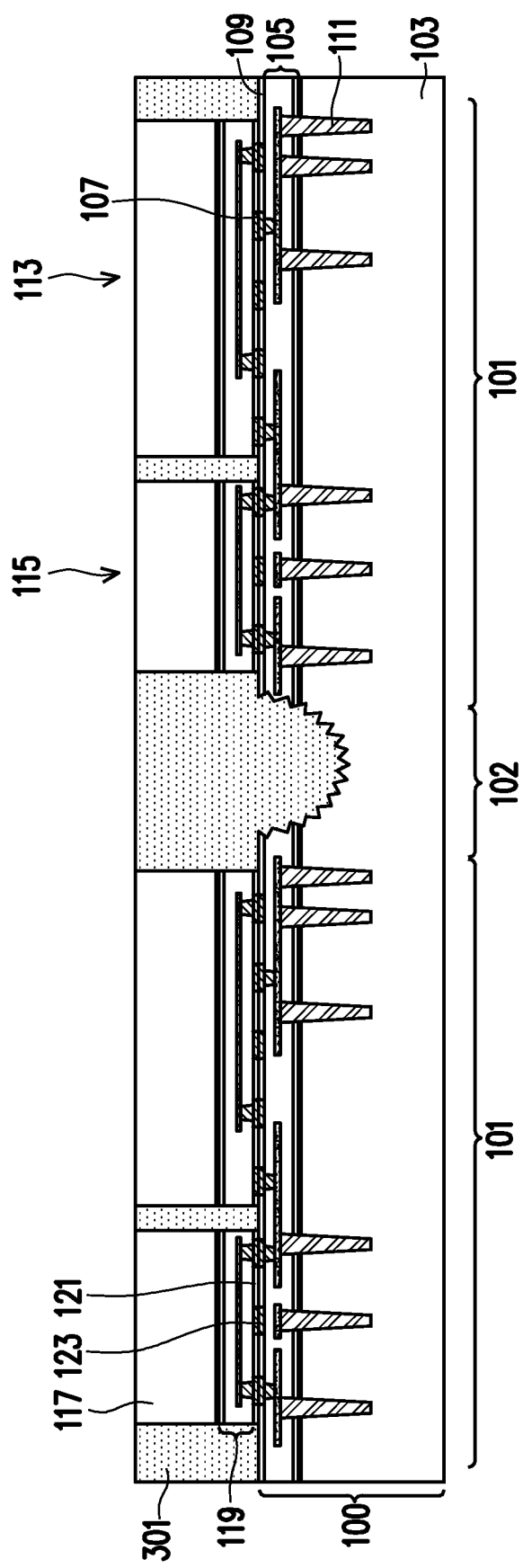
FIG. 3 illustrates a filling of the opening with an encapsulant, in accordance with some embodiments.

FIG. 3 illustrates that, once the first opening 201 has been formed, the second semiconductor devices 113, the third semiconductor devices 115, and the first semiconductor devices 101 may be encapsulated with a first encapsulant 301. In an embodiment the encapsulation may be performed in a molding device, which may comprise a top molding portion and a bottom molding portion separable from the top molding portion. When the top molding portion is lowered to be adjacent to the bottom molding portion, a molding cavity may be formed for the first semiconductor devices 101, the second semiconductor devices 113, and the third semiconductor devices 115.

During the encapsulation process the top molding portion may be placed adjacent to the bottom molding portion, thereby enclosing the first semiconductor devices 101, the second semiconductor devices 113, and the third semiconductor devices 115 within the molding cavity. Once enclosed, the top molding portion and the bottom molding portion may form an airtight seal in order to control the influx and outflux of gasses from the molding cavity. Once sealed, a first encapsulant 301 may be placed within the molding cavity.

The first encapsulant 301 may be an epoxy or a molding compound resin such as polyimide, polyphenylene sulfide (PPS), polyetheretherketone (PEEK), poly ether sulphone (PES), a heat resistant crystal resin, combinations of these, or the like. The first encapsulant 301 may be placed within the molding cavity prior to the alignment of the top molding portion and the bottom molding portion, or else may be injected into the molding cavity through an injection port, using compression molding, transfer molding, or the like.

Once the first encapsulant 301 is placed into the molding cavity such that the first encapsulant 301 encapsulates the first semiconductor devices 101, the second semiconductor devices 113, and the third semiconductor devices 115, the first encapsulant 301 may be cured in order to harden the first encapsulant 301 for optimum protection. While the exact curing process is dependent at least in part on the particular material chosen for the first encapsulant 301, in an embodiment in which molding compound is chosen as the first encapsulant 301, the curing could occur through a process such as heating the first encapsulant 301 to between about 100° C. and about 200° C., such as about 125° C. for about 60 sec to about 3000 sec, such as about 600 sec. Additionally, initiators and/or catalysts may be included within the first encapsulant 301 to better control the curing process.

However, as one having ordinary skill in the art will recognize, the curing process described above is merely an exemplary process and is not meant to limit the current embodiments. Other curing processes, such as irradiation or even allowing the first encapsulant 301 to harden at ambient temperature, may also be used. Any suitable curing process may be used, and all such processes are fully intended to be included within the scope of the embodiments discussed herein.

FIG. 3 further illustrates a thinning of the first encapsulant 301 in order to expose the second semiconductor devices 113 and the third semiconductor devices 115 for further processing. The thinning may be performed, e.g., using a mechanical grinding, chemical approaches, or chemical mechanical polishing (CMP) process whereby chemical etchants and abrasives are utilized to react and grind away the first encapsulant 301 so that the second semiconductor devices 113 and the third semiconductor devices 115 have been exposed and the first encapsulant 301 has a thickness of between about 100 µm and about 150 µm. As such, the second semiconductor devices 113 and the third semiconductor devices 115 may have a planar surface that is also coplanar with the first encapsulant 301. In another embodiment, the grinding may be omitted. For example, if the second semiconductor devices 113 and the third semiconductor devices 115 are already exposed after encapsulation, the grinding may be omitted.

Furthermore, while the CMP process described above is presented as one illustrative embodiment, it is not intended to be limiting to the embodiments. Any other suitable removal process may be used to thin the first encapsulant 301. For example, a series of chemical etches may be utilized. This process and any other suitable process may be utilized to planarize the first encapsulant 301, and all such processes are fully intended to be included within the scope of the embodiments.

Figure 4:
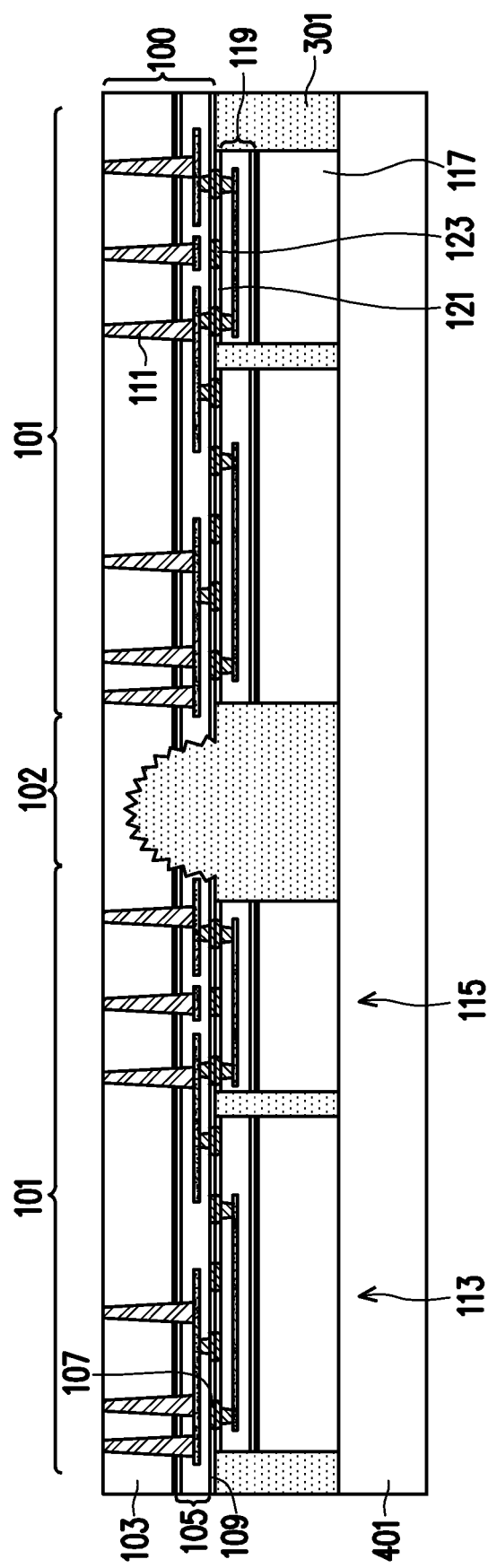
FIG. 4 illustrates a thinning of the semiconductor wafer, in accordance with some embodiments.

FIG. 4 illustrates a placement of a first carrier substrate 401 and a thinning of a back side of the first substrate 103 to expose the TSVs 111. In an embodiment the first carrier substrate 401 comprises, for example, silicon based materials, such as glass or silicon oxide, or other materials, such as aluminum oxide, combinations of any of these materials, or the like. The first carrier substrate 401 is planar in order to accommodate the attachment of the second semiconductor device 113 and the third semiconductor device 115, which may be attached through a bonding process or through the use of an adhesive layer (not separately illustrated).

Once attached, the second side of the first substrate 103 may be thinned in order to expose the TSVs 111. In an embodiment, the thinning of the second side of the first substrate 103 may leave the TSVs 111 exposed. The thinning of the second side of the first substrate 103 may be performed by a planarization process such as CMP or etching. However, any suitable method of thinning the second side of the first substrate 103 may be used.

Figure 5:
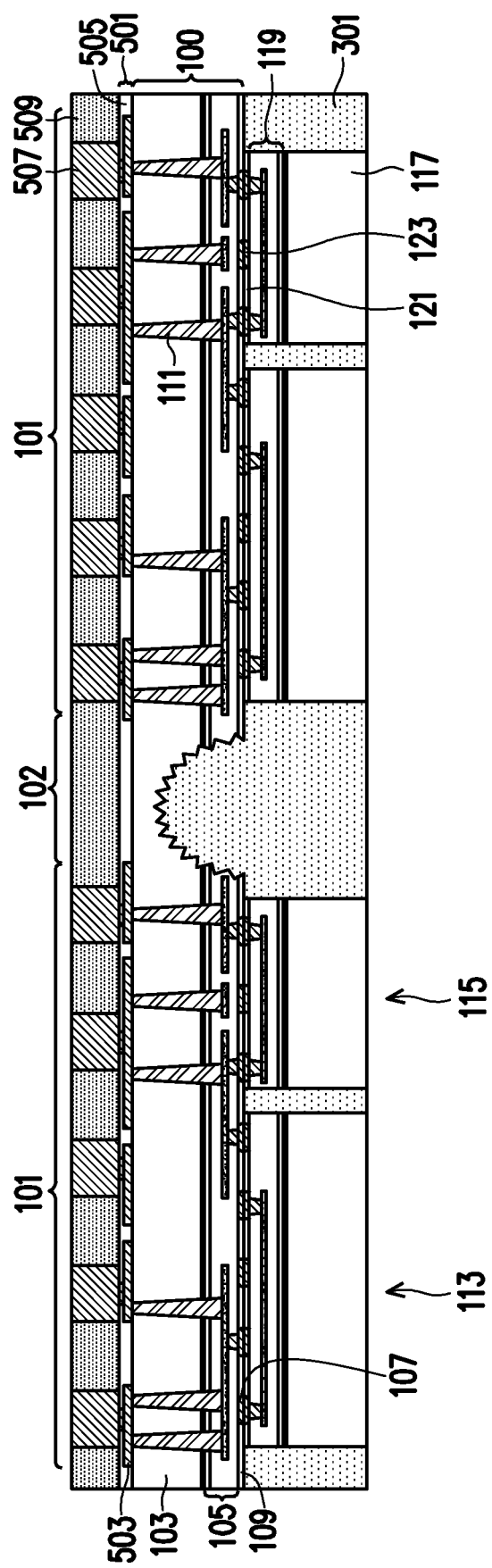
FIG. 5 illustrates a formation of a redistribution structure, in accordance with some embodiments.

FIG. 5 illustrates a formation of a redistribution structure 501 with one or more layers over the second side of the first substrate 103 and in connection with the TSVs 111. In an embodiment the redistribution structure 501 may be formed by initially forming a first redistribution layer 503 over and in electrical connection with the TSVs 111. In an embodiment the first redistribution layer 503 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 503 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 4 µm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 503.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Once the first redistribution layer 503 has been formed, a redistribution passivation layer 505 may be formed. In an embodiment the redistribution passivation layer 505 may be polybenzoxazole (PBO), although any suitable material, such as polyimide or a polyimide derivative, such as a low temperature cured polyimide, may alternatively be utilized. The redistribution passivation layer 505 may be placed using, e.g., a spin-coating process to a thickness of between about 5 µm and about 17 µm, such as about 7 µm, although any suitable method and thickness may be used.

Once the redistribution passivation layer 505 has been formed, the redistribution passivation layer 505 may be patterned to allow for electrical contact to the underlying first redistribution layer 503. In an embodiment the redistribution passivation layer 505 may be patterned using, e.g., a photolithographic masking and etching process. However, any suitable process may be utilized to expose the underlying first redistribution layer 503.

Additionally, if desired, additional layers of the first redistribution layer 503 and the redistribution passivation layer 505 may be formed to provide additional interconnection options. In particular, any suitable number of conductive and dielectric layers may be formed using the processes and materials described herein. All such layers are fully intended to be included within the scope of the embodiments.

Once the redistribution passivation layer 505 has been formed and patterned, first external connectors 507 may be formed. In an embodiment the first external connectors 507 may be conductive pillars, such as copper pillars. In an embodiment the conductive pillars may be formed by initially forming a seed layer and then applying and patterning a photoresist with openings exposing the seed layer where the conductive pillar is desired to be located. Conductive material, such as copper, tungsten, other conductive metals, or the like, may then be formed within the photoresist using a process such as electroplating, electroless plating, or the like. Once formed, the photoresist is removed and the seed layer is patterned using the conductive material as a mask.

Optionally, if desired the first external connectors 507 may be capped with a solder material (not separately illustrated). In such an embodiment solder bumps may be formed by initially forming a layer of tin through any suitable method such as evaporation, electroplating, printing, solder transfer to place the material of the cap. Once in place, a reflow may be performed in order to shape the material into the desired bump shape.

Once the first external connectors 507 have been formed, a first passivation layer 509 is formed to protect the first external connectors 507. In an embodiment the first passivation layer 509 may be made of one or more suitable dielectric materials such as silicon oxide, silicon nitride, or polybenzoxazole (PBO), although any suitable material, such as polyimide or a polyimide derivative, such as a low temperature cured polyimide, combinations of these, or the like may be used. The first passivation layer 509 may be formed using a process such as CVD, PVD, ALD, combinations of these, or the like. However, any suitable materials and processes may be utilized.

However, the above described embodiment in which the first external connectors 507 are formed, patterned, and the first passivation layer 509 placed before being planarized is intended to be illustrative and is not intended to be limiting upon the embodiments. Rather, any suitable method of formation of the first external connectors 507 and the first passivation layer 509 may be utilized. In other embodiments, the first passivation layer 509 may be formed first and then patterned using, for example, a photolithographic patterning process, and then the first external connectors 507 are plated within the first passivation layer 509 before being planarized using a planarization process. Any such manufacturing process is fully intended to be included within the scope of the embodiments.

FIG. 5 also illustrates a removal of the first carrier substrate 401 in preparation for a singulation process. In an embodiment the first carrier substrate 401 may be removed by directing energy at the adhesion layer, thereby reducing its adhesion and allowing both the adhesion layer and the first carrier substrate 401 to be removed.

Figure 6:
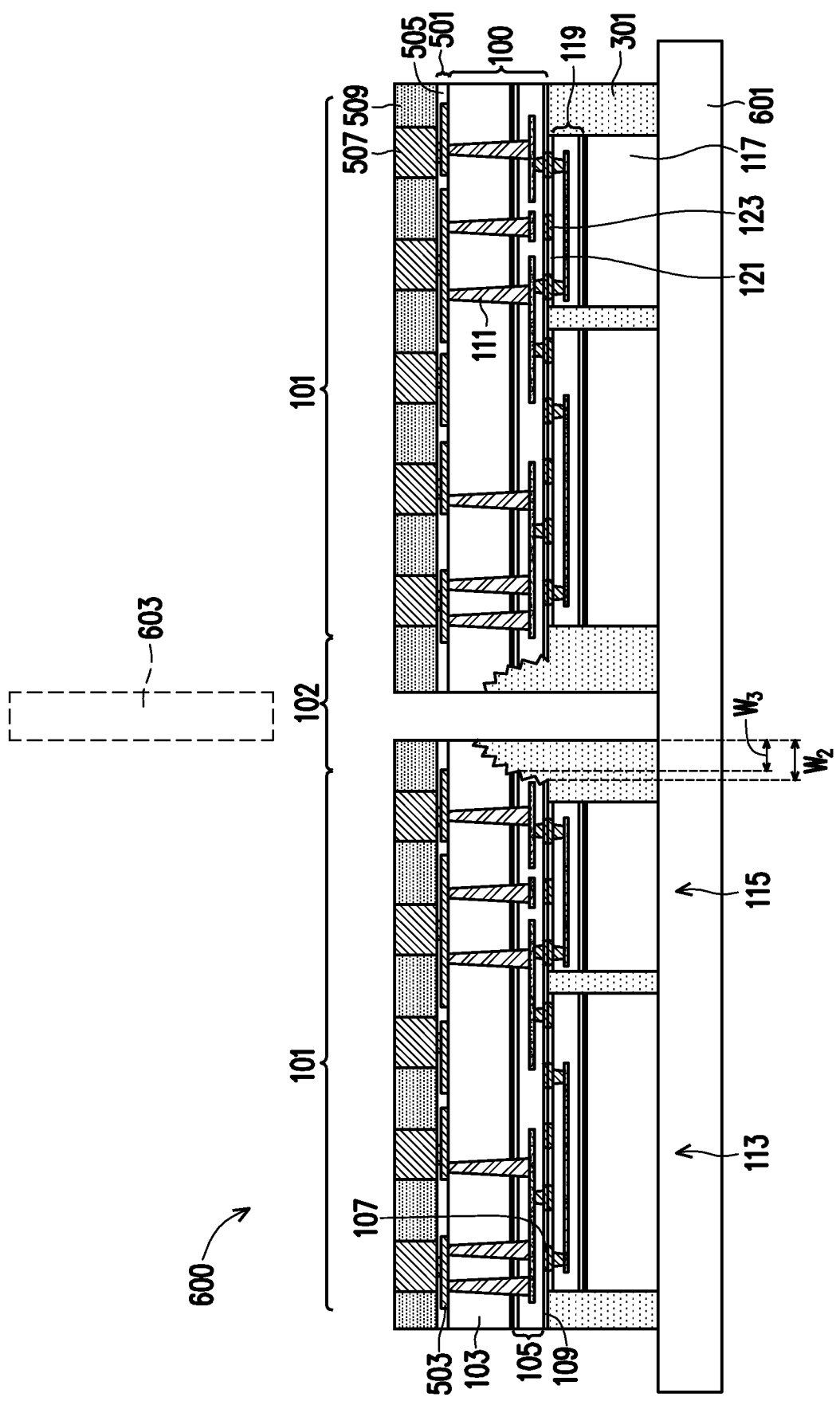
FIG. 6 illustrates a singulation process, in accordance with some embodiments.

FIG. 6 illustrates that, once the first carrier substrate 401 has been removed, the structure is singulated through the first opening 201 (and, hence through the first encapsulant 301 located within the first opening 201) to form a singulated semiconductor device 600, such as a system on integrated circuit. In preparation for the singulation process, the first encapsulant 301, the second semiconductor devices 113, and the third semiconductor devices 115 are placed on a support structure such as a film frame 601. However, any suitable support structure may be utilized.

Once in place on the film frame 601, the singulation may be performed by using a saw blade (represented in FIG. 6 by the dashed box 603) to slice through the first encapsulant 301 between the first semiconductor devices 101, thereby separating one of the first semiconductor devices 101 (with each of the second semiconductor devices 113 and the third semiconductor devices 115 bonded to it) from another one of the first semiconductor devices 101.

However, because some of the material from the first metallization layers 105 has been removed and recessed from the path of the saw blade 603, and the remaining material has been reinforced through the placement of the first encapsulant 301, less damage occurs during the singulation process. For example, the stresses that are present as the saw blade 603 slices through the semiconductor wafer 100 are not translated directly to the fragile extremely low-k materials that are present within the first metallization layers 105 because the saw blade 603, quite simple, does not touch the fragile extremely low-k materials. Further, by placing the first encapsulant 301 between the saw blade 603 and the fragile materials, the first encapsulant 301 can act as a buffer to help protect the materials. All of this helps to prevent damage such as delamination from occurring during the singulation process.

By forming the first opening 201, filling the first opening 201 with the first encapsulant 301, and then singulating through the first encapsulant 301, the first encapsulant 301 will have a decreasing width as the first encapsulant 301 extends further into the first substrate 103. For example, after the singulation, the first encapsulant 301 has a second width $W_2$ adjacent to the first metallization layers 105 of between about 3 µm and about 10 µm, such as about 5 µm, while also having a third width $W_3$ adjacent to a top surface of the first substrate 103 of between about 2 µm and about 8 µm, such as about 4 µm. However, any suitable dimensions may be utilized.

Figure 7:
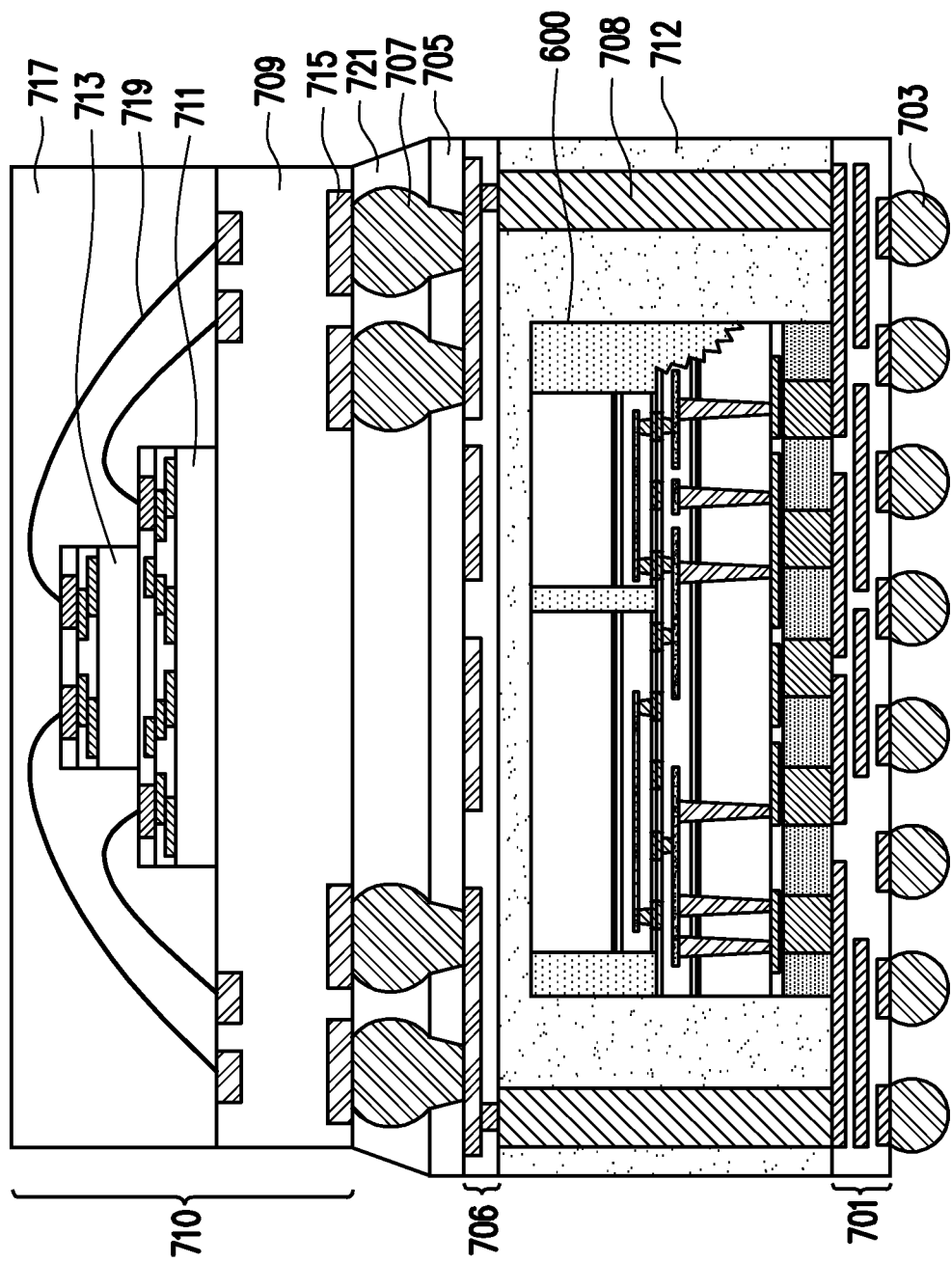
FIG. 7 illustrates an integrated fan out process, in accordance with some embodiments.

FIG. 7 illustrates that, once the singulated semiconductor device 600 has been formed, the singulated semiconductor device 600 may be incorporated into an integrated fan out process to integrate the singulated semiconductor device 600 with other devices. In an embodiment the integrated fan out process may utilize a second carrier substrate (not illustrated in FIG. 7), a second adhesion layer (also not illustrated in FIG. 7), a polymer layer 705, second redistribution layers 706, and second through integrated fan out vias (TIVs) 708. In an embodiment the second carrier substrate is used as an initial based for manufacturing and comprises, for example, silicon based materials, such as glass or silicon oxide, or other materials, such as aluminum oxide, combinations of any of these materials, or the like. The second carrier substrate is planar in order to accommodate an attachment of devices such as the singulated semiconductor device 600.

The second adhesion layer may be placed over the second carrier substrate in order to assist in the attachment of overlying structures to the second carrier substrate. In an embodiment the second adhesion layer is a die attached film (DAF), such as an epoxy resin, a phenol resin, acrylic rubber, silica filler, or a combination thereof, and is applied using a lamination technique. However, any other suitable material and method of formation may be utilized.

The polymer layer 705 is initially formed over the second adhesion layer. In an embodiment the polymer layer 705 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The polymer layer 705 may be formed through a process such as chemical vapor deposition (CVD), although any suitable process may be utilized, and may have a thickness between about 0.5 µm and about 5 µm.

Once the polymer layer 705 has been formed, underbump metallization layers and the second redistribution layers 706 may be formed over the polymer layer 705. In an embodiment the underbump metallization layers may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers. Any suitable materials or layers of material that may be used for the underbump metallization layers are fully intended to be included within the scope of the embodiments.

In an embodiment the underbump metallization layers are created by forming each layer over the polymer layer 705. The forming of each layer may be performed using a plating process, such as electrochemical plating, although other processes of formation, such as sputtering, evaporation, or PECVD process, may alternatively be used depending upon the desired materials. The underbump metallization layers may be formed to have a thickness of between about 0.7 µm and about 10 µm, such as about 5 µm.

In an embodiment the second redistribution layers 706 comprise a series of conductive layers embedded within a series of dielectric layers. In an embodiment, a first one of the series of dielectric layers is formed over the polymer layer 705, and the first one of the series of dielectric layers may be a material such as polybenzoxazole (PBO), although any suitable material, such as polyimide or a polyimide derivative, may be utilized. The first one of the series of dielectric layers may be placed using, e.g., a spin-coating process, although any suitable method may be used.

After the first one of the series of dielectric layers has been formed, openings may be made through the first one of the series of dielectric layers by removing portions of the first one of the series of dielectric layers. The openings may be formed using a suitable photolithographic mask and etching process, although any suitable process or processes may be used to pattern the first one of the series of dielectric layers.

Once the first one of the series of dielectric layers has been formed and patterned, a first one of the series of conductive layers is formed over the first one of the series of dielectric layers and through the openings formed within the first one of the series of dielectric layers. In an embodiment the first one of the series of conductive layers may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first one of the series of conductive layers is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers has been formed, a second one of the series of dielectric layers and a second one of the series of conductive layers may be formed by repeating steps similar to the first one of the series of dielectric layers and the first one of the series of conductive layers. These steps may be repeated as desired in order to electrically connect each of the series of conductive layers to an underlying one of the series of conductive layers, and may be repeated as often as desired until an uppermost one of the series of conductive layers and an uppermost one of the series of dielectric layers has been formed. In an embodiment the deposition and patterning of the series of conductive layers and the series of dielectric layers may be continued until the second redistribution layers 706 have a desired number of layers, although any suitable number of individual layers may be utilized.

Once the second redistribution layers 706 have been formed over the second carrier substrate, the second TIVs 708 are formed in electrical connection with the second redistribution layers 706. In an embodiment the second TIVs 708 may be formed by initially forming a seed layer (not separately illustrated). In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer has been formed, a photoresist (also not illustrated) is placed over the seed layer. In an embodiment the photoresist may be placed on the seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern for the second TIVs 708. The second TIVs 708 are formed in such a placement as to be located on different sides of subsequently attached devices. However, any suitable arrangement for the pattern of second TIVs 708 may be utilized.

In an embodiment the second TIVs 708 are formed within the photoresist from one or more conductive materials, such as copper, tungsten, other conductive metals, or the like, and may be formed, for example, by electroplating, electroless plating, or the like. For example, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the second TIVs 708 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the second TIVs 708) may be removed by, for example, a wet or dry etching process. For example, in a dry etching process reactants may be directed towards the seed layer using the second TIVs 708 as masks. In another embodiment, etchants may be sprayed or otherwise put into contact with the seed layer in order to remove the exposed portions of the seed layer. After the exposed portion of the seed layer has been etched away, a portion of the second redistribution layers 706 is exposed between the second TIVs 708.

Once the second TIVs 708 have been formed, the singulated semiconductor device 600 may be placed on the second redistribution layers 706. In an embodiment the singulated semiconductor device 600 may be placed using, e.g., a pick and place process. However, any other method of placing the singulated semiconductor device 600 may be used.

FIG. 7 additionally illustrates that, once the singulated semiconductor device 600 has been placed, the singulated semiconductor device 600 and the second TIVs 708 can be encapsulated with a second encapsulant 712. In an embodiment the singulated semiconductor device 600 and second TIVs 708 may be encapsulated using a process similar to the encapsulation of the second semiconductor devices 113 and the third semiconductor device 115 as described above with respect to FIG. 3. Once encapsulated, the singulated semiconductor device 600 and second TIVs 708 and the second encapsulant 712 may be planarized to expose the singulated semiconductor device 600 and the second TIVs 708.

FIG. 7 also illustrates that, once the singulated semiconductor device 600 and the second TIVs 708 are encapsulated, a third redistribution layer 701 is formed in order to interconnect the singulated semiconductor device 600 and the second TIVs 708. In an embodiment the third redistribution layer 701 may be formed similar to the formation of the second redistribution layers 706 (described above with respect to FIG. 7). For example a series of passivation layers and conductive layers are deposited and planarized to form one or more layers of conductive routing. However, any suitable methods and materials may be utilized.

In a particular embodiment, three conductive layers may be formed. However, the use of three conductive layers is intended to be illustrative and is not intended to be limiting. Rather, any suitable number of conductive layers and passivation layers may be utilized, and all such number of layers is fully intended to be included within the scope of the embodiments.

FIG. 7 further illustrates a formation of third external connectors 703 to make electrical contact with the third redistribution layer 701. In an embodiment the third external connectors 703 may be placed on the third redistribution layer 701 and may be a ball grid array (BGA) which comprises a eutectic material such as solder, although any suitable materials may be used. Optionally, an underbump metallization may be utilized between the third external connectors 703 and the third redistribution layer 701. In an embodiment in which the third external connectors 703 are solder bumps, the third external connectors 703 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape. Once the third external connectors 703 have been formed, a test may be performed to ensure that the structure is suitable for further processing.

After the test, the second carrier substrate may be debonded from the singulated semiconductor device 600. In an embodiment the third external connectors 703 and, hence, the structure including the singulated semiconductor device 600, may be attached to a ring structure (not illustrated in FIG. 7). The ring structure may be a metal ring intended to provide support and stability for the structure during and after the debonding process. In an embodiment the third external connectors 703 are attached to the ring structure using, e.g., a ultraviolet tape, although any other suitable adhesive or attachment may be used. Once attached, the second adhesion layer may be irradiated and the second adhesion layer and the second carrier substrate may be physically removed.

Once the second carrier substrate has been removed and the polymer layer 705 has been exposed, the polymer layer 705 may be patterned using, e.g., a laser drilling method, by which a laser is directed towards those portions of the polymer layer 705 which are desired to be removed in order to expose the underlying second redistribution layer 706. During the laser drilling process the drill energy may be in a range from 0.1 mJ to about 60 mJ, and a drill angle of about 0 degree (perpendicular to the polymer layer 705) to about 85 degrees to normal of the polymer layer 705.

FIG. 7 additionally illustrates a placement of fourth external connections 707. In an embodiment the fourth external connections 707 may be contact bumps such as microbumps or controlled collapse chip connection ($C_4$) bumps and may comprise a material such as tin, or other suitable materials, such as solder paste, silver, or copper. In an embodiment in which the fourth external connections 707 are tin solder bumps, the fourth external connections 707 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

FIG. 7 additionally illustrates a bonding of the fourth external connections 707 to a first package 710. In an embodiment the first package 710 may comprise a third substrate 709, a fifth semiconductor device 711, a sixth semiconductor device 713 (bonded to the fifth semiconductor device 711), third contact pads 715 (for electrical connection to the fourth external connections 707), and a third encapsulant 717. In an embodiment the third substrate 709 may be, e.g., a packaging substrate comprising internal interconnects (e.g., through substrate vias) to connect the fifth semiconductor device 711 and the sixth semiconductor device 713 to the fourth external connections 707.

In another embodiment, the third substrate 709 may be an interposer used as an intermediate substrate to connect the fifth semiconductor device 711 and the sixth semiconductor device 713 to the fourth external connections 707. In this embodiment the third substrate 709 may be, e.g., a silicon substrate, doped or undoped, or an active layer of a silicon-on-insulator (SOI) substrate. However, the third substrate 709 may also be a glass substrate, a ceramic substrate, a polymer substrate, or any other substrate that may provide a suitable protection and/or interconnection functionality. These and any other suitable materials may be used for the third substrate 709.

The fifth semiconductor device 711 may be a semiconductor device designed for an intended purpose such as being a logic die, a central processing unit (CPU) die, a memory die (e.g., a DRAM die), combinations of these, or the like. In an embodiment the fifth semiconductor device 711 comprises integrated circuit devices, such as transistors, capacitors, inductors, resistors, first metallization layers (not shown), and the like, therein, as desired for a particular functionality. In an embodiment the fifth semiconductor device 711 is designed and manufactured to work in conjunction with or concurrently with the singulated semiconductor device 600.

The sixth semiconductor device 713 may be similar to the fifth semiconductor device 711. For example, the sixth semiconductor device 713 may be a semiconductor device designed for an intended purpose (e.g., a DRAM die) and comprising integrated circuit devices for a desired functionality. In an embodiment the sixth semiconductor device 713 is designed to work in conjunction with or concurrently with the singulated semiconductor device 600 and/or the fifth semiconductor device 711.

The sixth semiconductor device 713 may be bonded to the fifth semiconductor device 711. In an embodiment the sixth semiconductor device 713 is only physically bonded with the fifth semiconductor device 711, such as by using an adhesive. In this embodiment the sixth semiconductor device 713 and the fifth semiconductor device 711 may be electrically connected to the third substrate 709 using, e.g., wire bonds 719, although any suitable electrical bonding may be utilized.

In another embodiment, the sixth semiconductor device 713 may be bonded to the fifth semiconductor device 711 both physically and electrically. In this embodiment the sixth semiconductor device 713 may comprise fourth external connections (not separately illustrated in FIG. 7) that connect with fifth external connections (also not separately illustrated in FIG. 7) on the fifth semiconductor device 711 in order to interconnect the sixth semiconductor device 713 with the fifth semiconductor device 711.

The third contact pads 715 may be formed on the third substrate 709 to form electrical connections between the fifth semiconductor device 711 and, e.g., the fourth external connections 707. In an embodiment the third contact pads 715 may be formed over and in electrical contact with electrical routing (such as through substrate vias) within the third substrate 709. The third contact pads 715 may comprise aluminum, but other materials, such as copper, may also be used. The third contact pads 715 may be formed using a deposition process, such as sputtering, to form a layer of material (not shown) and portions of the layer of material may then be removed through a suitable process (such as photolithographic masking and etching) to form the third contact pads 715. However, any other suitable process may be utilized to form the third contact pads 715. The third contact pads 715 may be formed to have a thickness of between about 0.5 µm and about 4 µm, such as about 1.45 µm.

The third encapsulant 717 may be used to encapsulate and protect the fifth semiconductor device 711, the sixth semiconductor device 713, and the third substrate 709. In an embodiment the third encapsulant 717 may be a molding compound and may be placed using a molding device (not illustrated in FIG. 7). For example, the third substrate 709, the fifth semiconductor device 711, and the sixth semiconductor device 713 may be placed within a cavity of the molding device, and the cavity may be hermetically sealed. The third encapsulant 717 may be placed within the cavity either before the cavity is hermetically sealed or else may be injected into the cavity through an injection port. In an embodiment the third encapsulant 717 may be a molding compound resin such as polyimide, PPS, PEEK, PES, a heat resistant crystal resin, combinations of these, or the like.

Once the third encapsulant 717 has been placed into the cavity such that the third encapsulant 717 encapsulates the region around the third substrate 709, the fifth semiconductor device 711, and the sixth semiconductor device 713, the third encapsulant 717 may be cured in order to harden the third encapsulant 717 for optimum protection. While the exact curing process is dependent at least in part on the particular material chosen for the third encapsulant 717, in an embodiment in which molding compound is chosen as the third encapsulant 717, the curing could occur through a process such as heating the third encapsulant 717 to between about 100° C. and about 130° C., such as about 125° C. for about 60 sec to about 3000 sec, such as about 600 sec. Additionally, initiators and/or catalysts may be included within the third encapsulant 717 to better control the curing process.

However, as one having ordinary skill in the art will recognize, the curing process described above is merely an exemplary process and is not meant to limit the current embodiments. Other curing processes, such as irradiation or even allowing the third encapsulant 717 to harden at ambient temperature, may be used. Any suitable curing process may be used, and all such processes are fully intended to be included within the scope of the embodiments discussed herein.

Once the fourth external connections 707 have been formed, the fourth external connections 707 are aligned with and placed into physical contact with the third contact pads 715, and a bonding is performed. For example, in an embodiment in which the fourth external connections 707 are solder bumps, the bonding process may comprise a reflow process whereby the temperature of the fourth external connections 707 is raised to a point where the fourth external connections 707 will liquefy and flow, thereby bonding the first package 710 to the fourth external connections 707 once the fourth external connections 707 resolidifies.

FIG. 7 also illustrates a placement of an underfill material 721 between the first package 710 and the polymer layer 705. In an embodiment the underfill material 721 is a protective material used to cushion and support the first package 710 from operational and environmental degradation, such as stresses caused by the generation of heat during operation. The underfill material 721 may be injected or otherwise formed in the space between the first package 710 and the polymer layer 705 and may, for example, comprise a liquid epoxy that is dispensed between the first package 710 and the polymer layer 705 and then cured to harden.

FIG. 7 additionally illustrates a singulation. In an embodiment the singulation may be performed by using a saw blade (not separately illustrated) to slice through the underfill material 721 and the second encapsulant 712. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the structure.

By removing a portion of the scribe region 102 prior to singulation, the singulated semiconductor device 600 can be manufactured with a reduced possibility of damage such as delamination of the extremely low-k dielectric materials. By reducing the possibility of damage, a larger yield can be achieved during the manufacturing process, and a more reliable semiconductor device can be manufactured.

Figure 8:
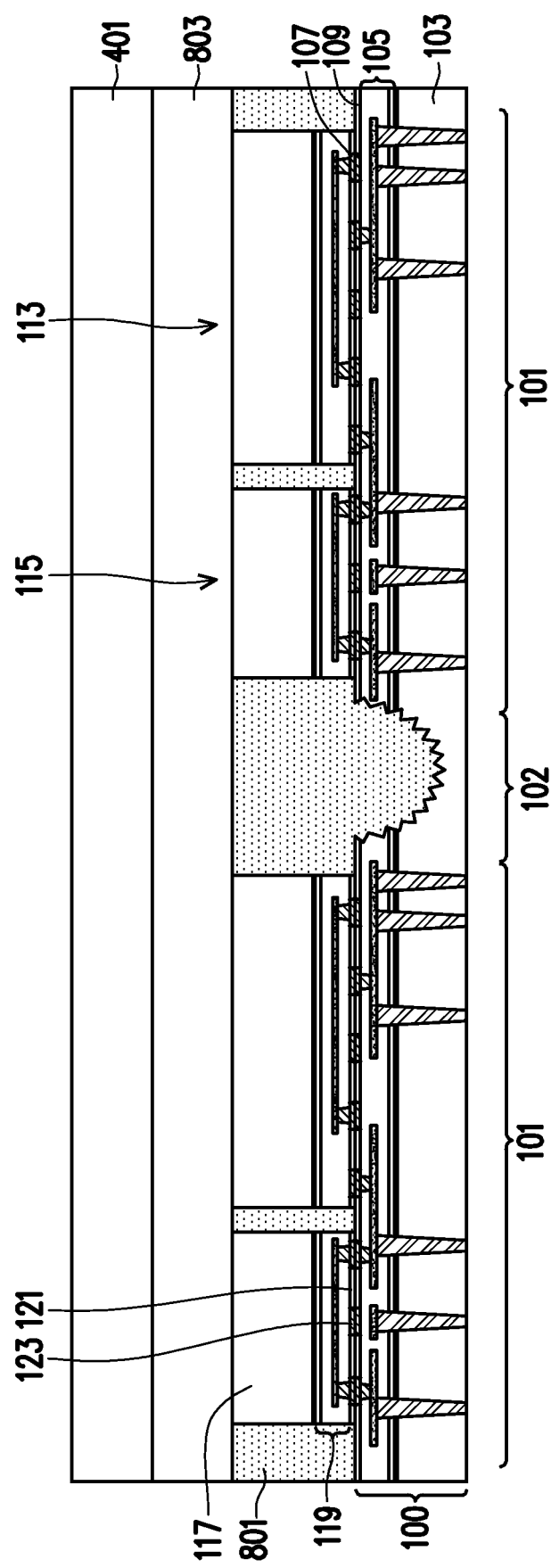
FIG. 8 illustrates placement of a support structure, in accordance with some embodiments.

FIG. 8 illustrates another embodiment in which a support structure 803 is utilized to help provide support in embodiments in which the first encapsulant 301, instead of being a material such as a molding compound, is a softer material such as a gap-fill material 801. In an embodiment the gap-fill material 801 may be a non-polymer, dielectric material such as silicon oxide, silicon nitride, combinations of these, or the like, which is deposited in place of the first encapsulant 301 using any suitable process. For example, the gap-fill material may be formed by CVD, PECVD or ALD deposition process, FCVD, or a spin-on-glass process, to fill and/or overfill the spaces between the second semiconductor device 113 and the third semiconductor device 115 and to also fill the first opening 201. Once the gap-fill material 801 has been deposited, the gap-fill material 801 may be planarized with the second semiconductor device 113 and the third semiconductor device 115 to a thickness of between about 20 µm and about 50 µm.

However, in embodiments in which a softer material is utilized, the support structure 803 may be utilized to provide additional support to buttress the gap-fill material 801. As such, FIG. 8 also illustrates a placement of the support structure 803 to help support the device and compensate for the different material in the gap-fill material 801. In an embodiment the support structure 803 may be a semiconductor material such as silicon (e.g., a silicon wafer). However, suitable support material, such as a glass support structure or even a metal support structure, may also be used.

The support structure 803 may be attached to the gap-fill material 801 using, e.g., a bonding process such as a fusion bonding process. In other embodiments the support structure 803 may be attached utilizing an adhesive or any other suitable material or method to attach the support structure 803 and the gap-fill material 801. All such materials and processes are fully intended to be included within the scope of the embodiments.

Once the support structure 803 has been attached, a remainder of the processes described above with respect to FIG. 4 may be followed. For example, the first carrier substrate 401 may be attached (to the support structure 803 in this embodiment) and the first substrate 103 may be thinned in order to expose the TSVs 111. However, any suitable process may be utilized.

Figure 9:
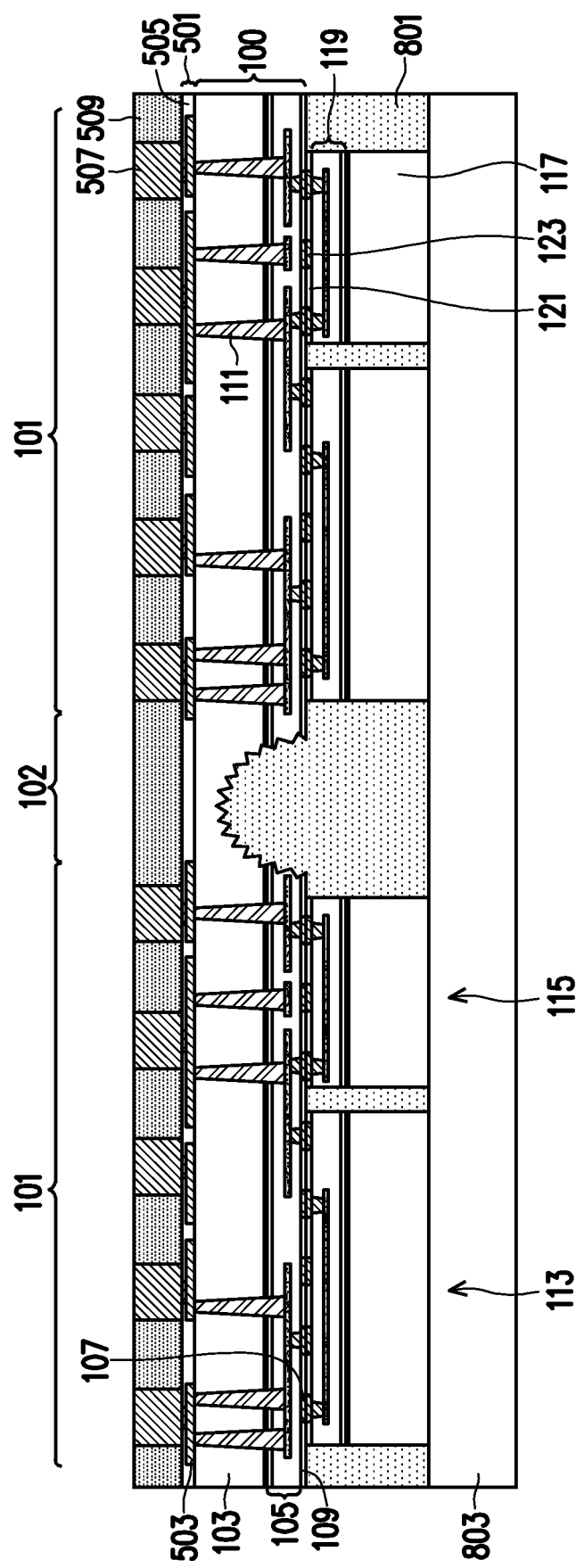
FIG. 9 illustrates a formation of the redistribution structure with the support structure, in accordance with some embodiments.

FIG. 9 illustrates a formation of the redistribution structure 501, the first external connectors 507, and the first passivation layer 509 with the support structure 803 still attached. In an embodiment the redistribution structure 501, the first external connectors 507, and the first passivation layer 509 may be formed as described above with respect to FIG. 5. However, any suitable processes and materials may be utilized.

Figure 10:
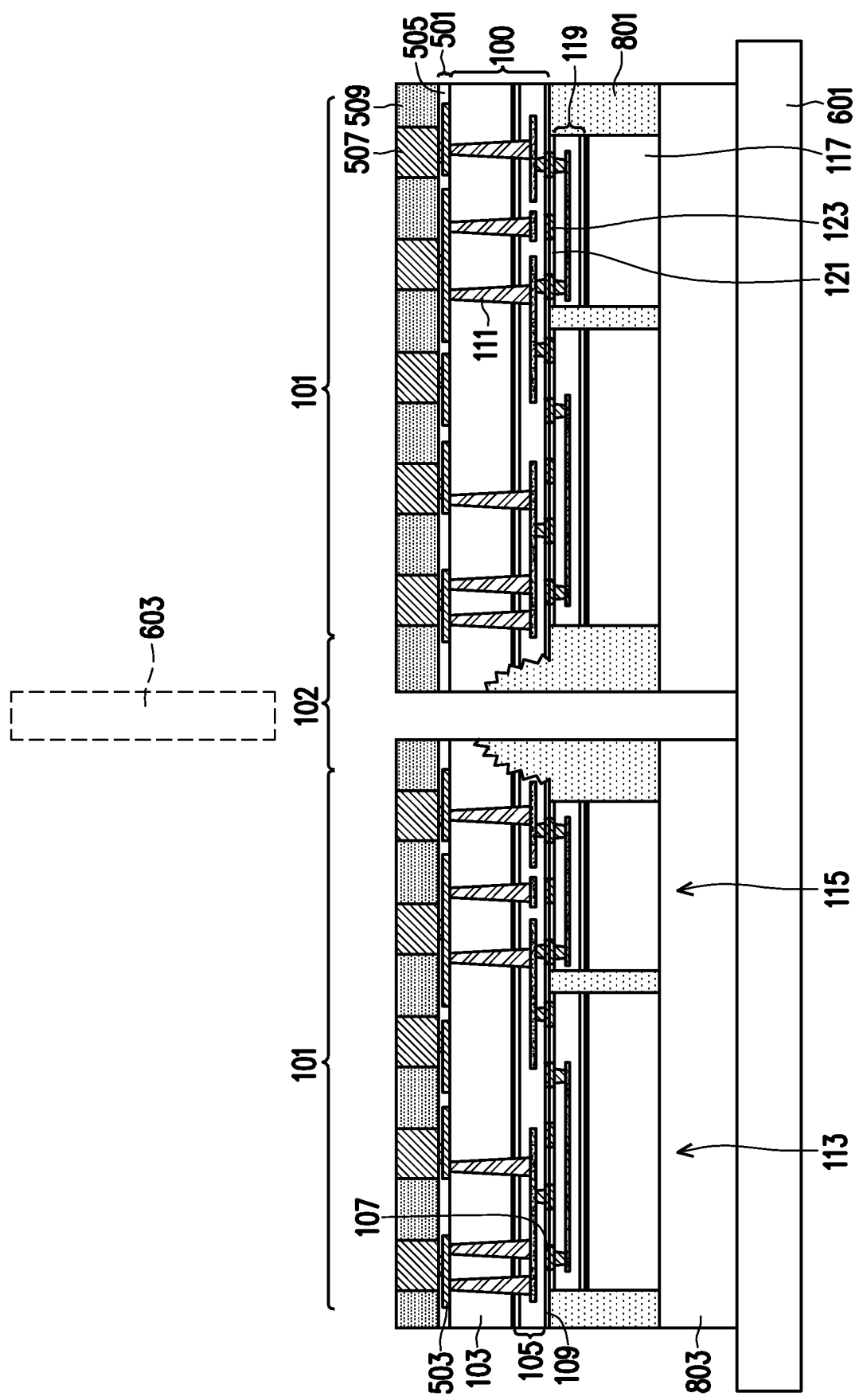
FIG. 10 illustrates a singulation process with the support structure, in accordance with some embodiments.

FIG. 10 illustrates a singulation of the structure along with the support structure 803. In an embodiment the singulation may be performed as described above with respect to FIG. 6. For example, a saw blade may be utilized to cut through the semiconductor wafer 100 as well as the gap-fill material 801 and the support structure 803 to form the singulated semiconductor device 600 with the support structure 803 still attached. However, any suitable method of singulating the device to form the singulated semiconductor device 600 may be utilized.

Additionally, in some embodiments the support structure 803 may either be removed using a debonding process, a thinning process, or any other suitable process for removing the support structure 803. In other embodiments, however, the support structure 803 may be left in place as part of the singulated semiconductor device 600, wherein the support structure 803 may not only provide structural support but may also be utilized as a heat sink to remove heat generated during operation of the second semiconductor device 113 and the third semiconductor device 115.

By utilizing the support structure 803, a wider array of materials may be utilized in order to encapsulate the second semiconductor device 113 and the third semiconductor device 115 to help reduce damage due to delamination during singulation. Additionally, subsequent attachments of heat sinks may be avoided by using the support structure 803 as an integrated heat sink. This, along with the reduction in damage from the singulation, helps to increase the manufacturing yield and reduce operational issues.

Figure 11:
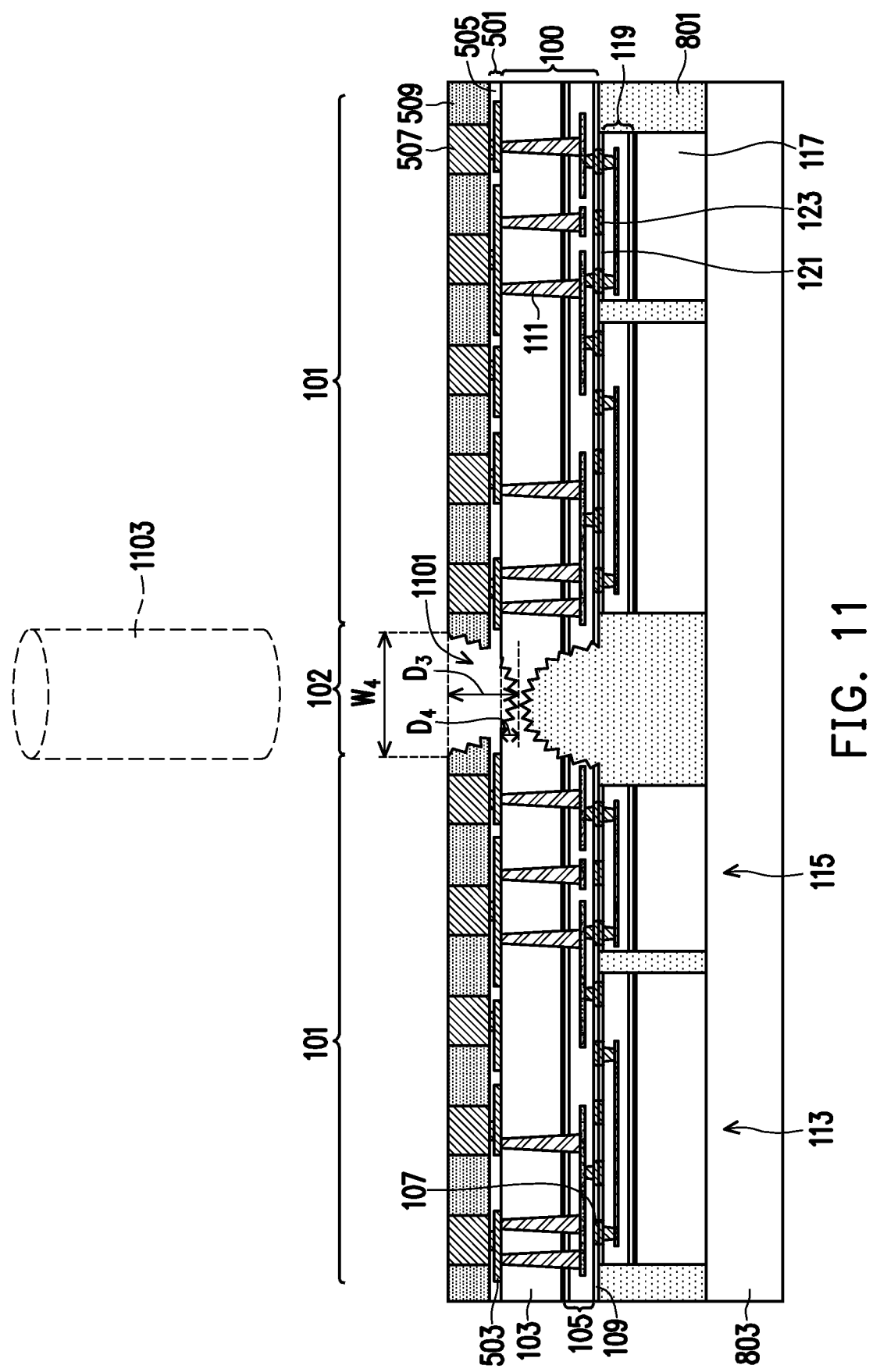
FIG. 11 illustrates a formation of a second opening, in accordance with some embodiments.

FIG. 11 illustrates another embodiment in which a second opening 1101 is utilized along with the first opening 201 (see FIG. 2) to help protect the structure from delamination damage during a subsequent singulation process. In this embodiment the structure is formed as described above with respect to FIGS. 1-5. However, once the redistribution structure 501, the first external connectors 507, and the first passivation layer 509 have been formed, the second opening 1101 is formed within the redistribution structure 501, the first external connectors 507, the first passivation layer 509 and the first substrate 103 in order to provide for additional space through which the singulation process (e.g., the saw blade) can pass.

In an embodiment the second opening 1101 may be formed using a second laser ablation process (represented in FIG. 11 by the dashed cylinder labeled 1103). For example, in some embodiments a laser is directed towards those portions of the first passivation layer 509 which are desired to be removed. During the second laser ablation process 1103 the drill angle of about 0 degree (perpendicular to the first metallization layers 105) to about 30 degrees to normal of the first passivation layer 509. However, any suitable parameters for the second laser ablation process 1103 may be utilized.

By utilizing the second laser ablation process 1103, the second opening 1101 may be formed to a third depth $D_3$ of between about 20 μm and about 30 μm, such as about 25 μm. As such, the second opening 1101 will extend into the first substrate 103 to a fourth depth $D_4$ of between about 3 μm and about 8 μm, such as about 5 μm. Additionally, the second opening 1101 may be formed to have a fourth width $W_4$ of between about 50 μm and about 80 μm, such as about 60 μm. However, any suitable dimensions may be utilized.

Additionally, by utilizing the second laser ablation process 1103 the shape of the second opening 1101 will be irregular. For example, the second opening 1101 may have a roughly circular, curved shape, instead of straight sidewalls, that are formed from the second laser ablation process 1103. Further, the directing of the second laser ablation process 1103 will cause an uneven removal of material, resulting in the presence of indentations within the material of the first substrate 103.

However, while a laser drilling process is described as one possible embodiment to form the second opening 1101, the description of the laser drilling process is intended to be illustrative and is not intended to be limiting. Rather, any suitable process that can remove the desired materials, such as a photolithographic masking and etching process which may result in straight sidewalls, may also be utilized. All such processes are fully intended to be included within the scope of the embodiments.

Figure 12:
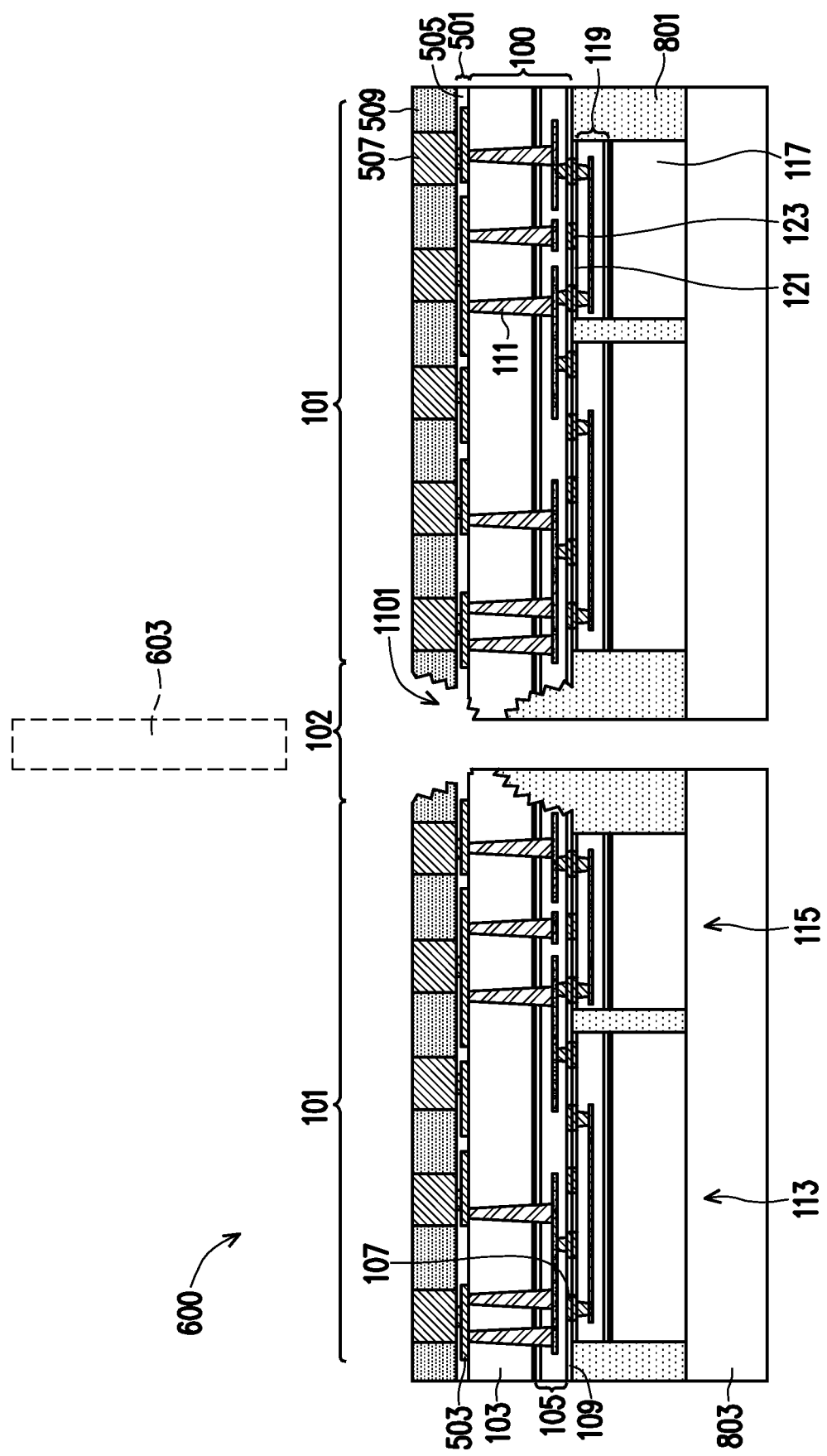
FIG. 12 illustrates a singulation process through the second opening, in accordance with some embodiments.

FIG. 12 illustrates that, once the second opening 1101 has been formed, the semiconductor wafer 100 may be singulated through both the first opening 201 and the second opening 1101. In an embodiment the singulation may be performed as described above with respect to FIG. 6. For example, the saw blade 603 may be used to cut through the semiconductor wafer 100 through both the second opening 1101 and the first opening 201. However, any suitable singulation process may be utilized.

Figure 13:
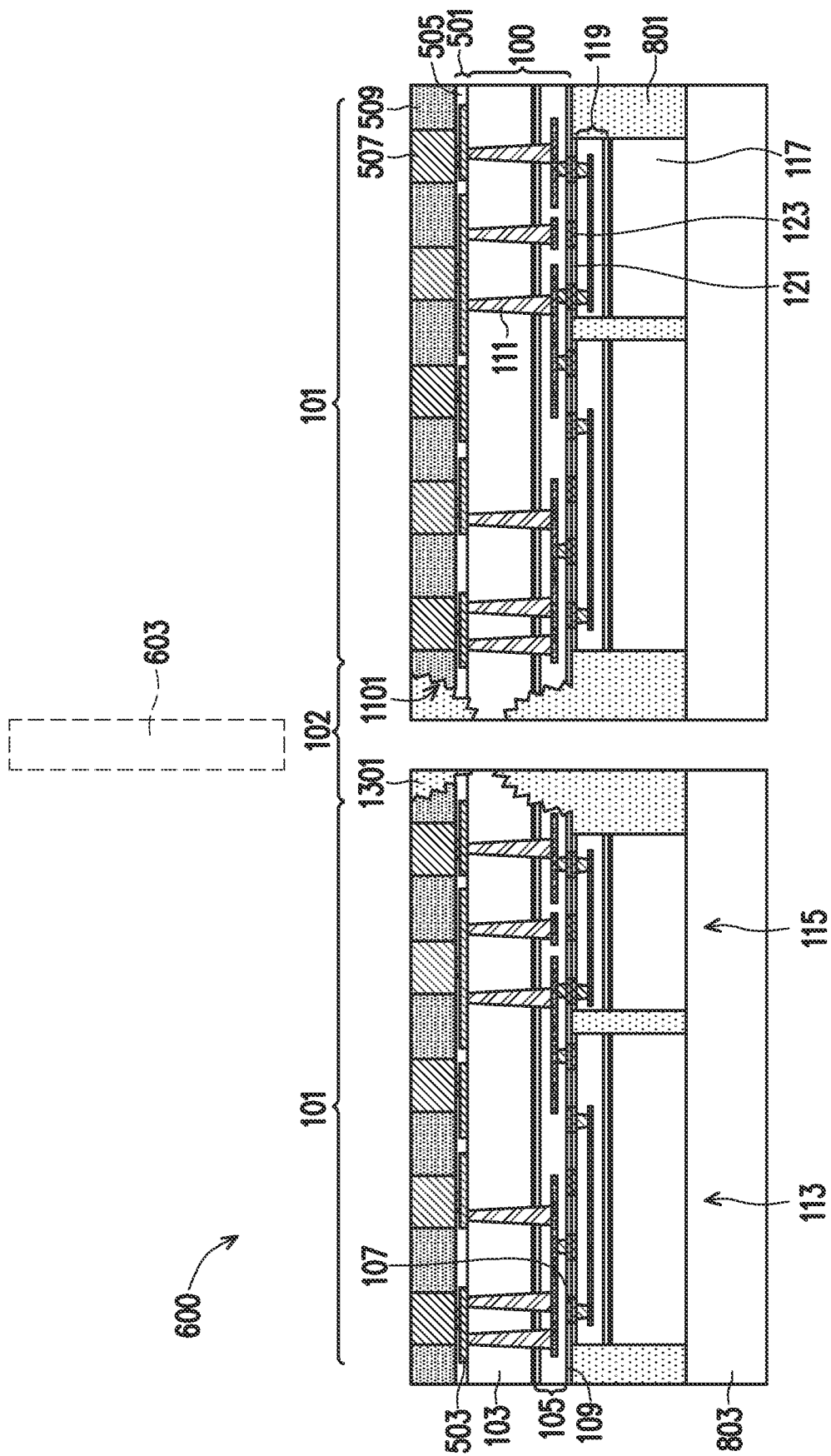
FIG. 13 illustrates a filling of the second opening, in accordance with some embodiments.

FIG. 13 illustrates yet another embodiment in which the second opening 1101, instead of simply being made, is also filled in order to provide additional structural support during the singulation process. In an embodiment the second opening 1101 may be filled with a fourth encapsulant 1301. Further, the fourth encapsulant 1301 may be a similar material and formed using similar methods as the first encapsulant 301 described above with respect to FIG. 3 or the gap-fill material 801 described above with respect to FIG. 8. For example, the fourth encapsulant 1301 may be a molding compound material or a gap-fill material, and may be applied using either a molding process or a deposition process to fill and/or overfill the second opening 1101. Once in place, if desired, the fourth encapsulant 1301 may be planarized using a process such as chemical mechanical polishing in order to embed the fourth encapsulant 1301 in the second opening 1101.

FIG. 13 also illustrates that, once the fourth encapsulant 1301 has been applied, the structure may be singulated through the first opening 201, the second opening 1101, and the fourth encapsulant 1301. In an embodiment the singulation may be performed as described above with respect to FIG. 6. For example, the saw blade 603 may be used to cut through the semiconductor wafer 100 through the second opening 1101 and the fourth encapsulant 1301. However, any suitable singulation process may be utilized.

By removing a portion of the scribe region 102 adjacent to both sides of the semiconductor wafer 100 prior to singulation, the singulated semiconductor device 600 can be manufactured with a reduced possibility of damage such as delamination of the dielectric materials in the first metallization layers 105 and the redistribution structure 501. By reducing the possibility of damage, a larger yield can be achieved during the manufacturing process, and a more reliable semiconductor device can be manufactured.

In accordance with an embodiment, a semiconductor device includes: metallization layers connecting active devices on a semiconductor substrate; a first semiconductor device connected to the metallization layers; a second semiconductor device connected to the metallization layers; and an encapsulant encapsulating the first semiconductor device and the second semiconductor device, the encapsulant being in physical contact with the metallization layers and the semiconductor substrate. In an embodiment the encapsulant comprises a molding compound. In an embodiment the encapsulant comprises silicon oxide. In an embodiment a support structure is attached to the silicon oxide. In an embodiment the encapsulant reduces in width as the encapsulant extends into the semiconductor substrate. In an embodiment the semiconductor device further includes: through substrate vias extending through the semiconductor substrate; redistribution layers connected to the through substrate vias; and a passivation layer adjacent to the redistribution layers. In an embodiment the passivation layer has a curved sidewall.

In accordance with another embodiment, a semiconductor device includes: a first semiconductor die bonded to a metallization layer over a semiconductor substrate; a second semiconductor die bonded to the metallization layer; an encapsulant extending between the first semiconductor die and the second semiconductor die, the encapsulant also extending through the metallization layer to make physical contact with the semiconductor substrate. In an embodiment the encapsulant has a first width adjacent to the metallization layer and a second width less than the first width adjacent to the semiconductor substrate. In an embodiment the encapsulant has a first surface that is planar with a second surface of the semiconductor substrate. In an embodiment the encapsulant is an oxide material. In an embodiment the semiconductor device further includes a support structure attached to the oxide material. In an embodiment the semiconductor device further includes: through substrate vias extending through the semiconductor substrate; redistribution layers connected to the through substrate vias; and a passivation layer adjacent to the redistribution layers. In an embodiment the semiconductor device further includes a second encapsulant extending through the redistribution layers to make physical contact with the semiconductor substrate.

In yet another embodiment, a method of manufacturing a semiconductor device, the method including: bonding a first semiconductor die to a device, the device comprising a semiconductor substrate; bonding a second semiconductor die to the device; forming an opening in the semiconductor substrate; filling the opening with a fill material; and singulating the semiconductor substrate through the fill material within the opening. In an embodiment the method further includes: thinning the semiconductor substrate to expose through substrate vias; forming redistribution layers in electrical connection with the through substrate vias; and applying a passivation layer over the redistribution layers. In an embodiment the method further includes forming a second opening extending through the passivation layer and into the semiconductor substrate prior to the singulating the semiconductor substrate. In an embodiment the filling the opening fills the opening with an oxide material. In an embodiment the method further includes attaching a support structure to the oxide material. In an embodiment the filling the opening fills the opening with a molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   metallization layers connecting active devices on a semiconductor substrate;
   through substrate vias extending through the semiconductor substrate;
   redistribution layers connected to the through substrate vias;
   a passivation layer adjacent to the redistribution layers;
   a first semiconductor device connected to the metallization layers;
   a second semiconductor device connected to the metallization layers; and
   an encapsulant encapsulating the first semiconductor device and the second semiconductor device, wherein the encapsulant has a first surface, the first surface being in physical contact with the metallization layers and the semiconductor substrate, the first surface having indentations into the metallization layers and the semiconductor substrate.

2. The semiconductor device of claim 1, wherein the encapsulant comprises a molding compound.

3. The semiconductor device of claim 1, wherein the encapsulant comprises silicon oxide.

4. The semiconductor device of claim 3, wherein a support structure is attached to the silicon oxide.

5. The semiconductor device of claim 1, wherein the encapsulant reduces in width as the encapsulant extends into the semiconductor substrate.

6. The semiconductor device of claim 1, wherein the passivation layer has a curved sidewall.

7. The semiconductor device of claim 1, further comprising a second encapsulant extending through the passivation layer and into the semiconductor substrate.

8. A semiconductor device comprising:
   a first semiconductor die bonded to a metallization layer over a semiconductor substrate;
   a second semiconductor die bonded to the metallization layer;
   a first encapsulant extending between the first semiconductor die and the second semiconductor die, the first encapsulant also extending through the metallization layer to make physical contact with the semiconductor substrate;
   through substrate vias extending through the semiconductor substrate;
   redistribution layers connected to the through substrate vias;
   a passivation layer adjacent to the redistribution layers; and
   a second encapsulant extending through the redistribution layers to make physical contact with the semiconductor substrate.

9. The semiconductor device of claim 8, wherein the first encapsulant has a first width adjacent to the metallization layer and a second width less than the first width adjacent to the semiconductor substrate.

10. The semiconductor device of claim 8, wherein the first encapsulant has a first surface that is planar with a second surface of the semiconductor substrate.

11. The semiconductor device of claim 8, wherein the first encapsulant is an oxide material.

12. The semiconductor device of claim 11, further comprising a support structure attached to the oxide material.

13. The semiconductor device of claim 8, wherein the second encapsulant comprises a non-polymer gap-filler material.

14. The semiconductor device of claim 8, wherein the second encapsulant has an irregular shape penetrating into the redistribution layers and the semiconductor substrate.

15. A semiconductor device comprising:
   a first semiconductor die bonded to a device, wherein the first semiconductor die is bonded to the device by a first metal to metal bond, the device comprising a semiconductor substrate;
   through substrate vias located within the semiconductor substrate;
   redistribution layers in electrical connection with the through substrate vias;

a passivation layer over the redistribution layers;

a second semiconductor die bonded to the device;

an opening along a sidewall of the semiconductor substrate; and a fill material filling the opening, wherein the fill material has a sidewall coplanar with the semiconductor substrate.

16. The semiconductor device of claim 15, further comprising a second opening extending through the passivation layer and into the semiconductor substrate.

17. The semiconductor device of claim 16, further comprising a second fill material filling the second opening.

18. The semiconductor device of claim 15, wherein the fill material comprises an oxide material.

19. The semiconductor device of claim 18, further comprising a support structure attached to the oxide material.

20. The semiconductor device of claim 15, wherein the fill material comprises a molding compound.

* * * * *